Sept. 18, 1973 J. ENCINAS 3,759,760

PREVENTION OF AUTO DOPING DURING THE MANUFACTURING
OF A SEMICONDUCTOR DEVICE
Filed May 4, 1970

JUAN ENCINAS,
INVENTOR.

BY Frank R. Jefferi
AGENT.

United States Patent Office 3,759,760 Patented Sept. 18, 1973

3,759,760

PREVENTION OF AUTODOPING DURING THE MANUFACTURING OF A SEMICONDUCTOR DEVICE

Juan Encinas, Caen, France, assignor to U.S. Philips Corporation, New York, N.Y.

Filed May 4, 1970, Ser. No. 34,490
Claims priority, application France, May 8, 1969, 6914719
Int. Cl. C23c *11/00;* H01l *19/00;* H02l *7/36*
U.S. Cl. 148—175 6 Claims

ABSTRACT OF THE DISCLOSURE

The invention relates to a method of manufacturing a semiconductor device in particular a lateral transistor with a buried layer.

Figure 1:
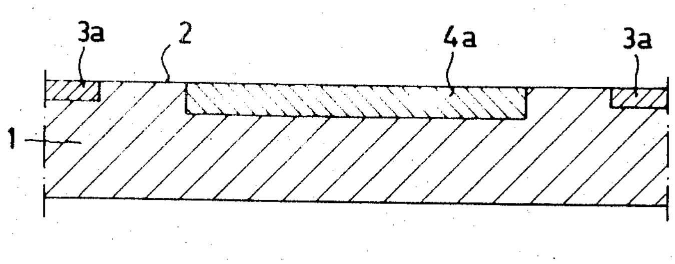

In this method, a region of the $n^+$ type is formed in a semiconductor substrate of the p-type by doping with arsenic. During the deposition of an epitaxial n-type layer the resistance becomes too low since the apparatus is contaminated with arsenic originating from the region. According to the invention this is prevented by interrupting the deposition of the epitaxial layer and continuing the epitaxial process in a cleaned apparatus.

The invention relates to a method of manufacturing a semiconductor device by means of epitaxial apparatus in which on a side of a semiconductor substrate a region is formed which has a high concentration of an impurity which causes a first conductivity type in the semiconductor, after which on the surface of the said side semiconductor material of the first conductivity type is deposited epitaxially. The invention also relates to a semiconductor device obtained by means of the method.

Such a semiconductor device comprises, for example, a semiconductor substrate provided with an epitaxial layer and a buried layer, which buried layer is provided by local deposition of an impurity on the substrate and diffusion of the impurity in the substrate and the epitaxial layer.

The said substrate is, for example, a homogeneous semiconductor wafer of a second conductivity type opposite to the first conductivity type or a wafer which comprises several layers or regions of different conductivity types situated one above the other.

It has often been found useful, for example, in a semiconductor device which comprises an epitaxial layer of the n-conductivity type on a semiconductor substrate of the p-type, to provide a strongly doped buried layer of the $n^+$ conductivity type, particularly when it deals with a lateral transistor, i.e. a transistor in which the emitter-, the base- and the collector zones are juxtaposed and do not surround each other.

Such a buried layer provided below the emitter and collector of a lateral transistor reduces the injection efficiency at those places where the emitter current cannot be collected. Such a buried layer is generally manufactured in silicon wafers on which, prior to the epitaxy, an arsenic-doped region is formed which, due to the limited diffusion rate of the arsenic, is particularly suitable for the formation of a buried layer of the $n^+$ type.

Nevertheless this method has an important drawback. At the temperature at which the epitaxial layer is deposited, arsenic vapors originating from the region spread in the epitaxial apparatus and a certain quantity of arsenic is deposited again simultaneously with the epitaxial layer and forms therein an impurity which reduces the resistance. As a result of this the epitaxial layer does not obtain the desirable quality which might be expected in the absence of a buried layer.

One of the objects of the invention is to avoid this drawback. The invention is based on the recognition of the fact that, when it is avoided that the impurity from the region deposits from the vapor phase simultaneously with the epitaxial deposition of the semiconductor material, it is possible to obtain at least an epitaxial upper layer of an excellent quality.

The method mentioned in the preamble is characterized in that, atfer the deposition of a first epitaxial layer, the deposition process is interrupted and a second epitaxial layer is deposited in an apparatus which is substantially free from the said impurity.

The apparatus in which the second layer is deposited, may be different from that in which the first layer is deposited. Alternatively, the two layers can be deposited in the same apparatus, the apparatus being cleaned between the deposition of the two layers. During this cleaning, substantially all the vapors and deposits of the impurity, for example, arsenic, originating from the reaction which would otherwise spread through the apparatus and deposit with the epitaxial layer, are removed.

It is to be noted that the vapor originating from the region is formed not only at the beginning of the epitaxy but also by out-diffusion via the epitaxial layer as long as the said layer is still thin. Cleaning is carried out only when the first epitaxial layer has obtained such a thickness that substantailly no impurity can evaporate from the epitaxial layer and spread in the apparatus.

By means of the method according to the invention epitaxial layers deposited, for example, on an arsenic-containing region are obtained the second layer of which, in which active and passive elements are to be formed afterwards, has an excellent resistance.

If the thickness of the first epitaxial layer is sufficient and the out-diffusion of the impurity from said layer is substantially zero, cleaning of the apparatus can be carried out such that substantially any trace of the said impurity is removed and the deposition can be continued, after which the second layer is substantially free from the impurity.

The thickness of the first epitaxial layer is prefereably chosen to be at least equal to 1 $\mu$m. The epitaxial layers are also preferably given substantially the same thickness.

Between the deposition of the two layers the surface of the first layer is preferably etched. During etching of the first layer, impurities are removed at the surface.

In a preferred embodiment of the method according to the invention, at least the region and the first epitaxial layer are subjected to a thermal treatment between the deposition of the two layers, a diffusion region of the impurity which causes the first conductivity type in the semiconductor being formed in the first layer.

The diffusion region can extend substantially throughout the thickness of the first epitaxial layer.

The thickness of a buried layer can be determined by the thermal treatment, particularly a thick buried layer can be made. For that purpose it may be of advantage to make the first epitaxial layer thicker than would be necessary to avoid out-diffusion.

In another preferred embodiment of the method according to the invention a region with an impurity which causes a second conductivity type opposite to the conductivity type in the semiconductor is formed on the said side of a substrate with a second conductivity type, the regions of both conductivity types are subjected to a thermal treatment in which the impurities are allowed to diffuse in the first epitaxial layer, a region of the impurity which causes the second conductivity type in the semiconductor is provided in the second epitaxial layer, after which the last-mentioned region is subjected to a thermal treatment, the last-mentioned impurity being allowed to diffuse in the second layer until the diffusion region of the last-mentioned impurity in the second layer forms an isolation diffusion region with the diffusion region of the same impurity in the first layer.

The last-mentioned impurity is, for example, boron.

If the substrate is p-type, the epitaxial layer is n-type, and the diffusion region with the impurity of the first conductivity type is a buried layer of the $n^+$ type with, for example, arsenic as an impurity, lateral p-n-p transistors can be made in integrated monolithic circuits in which the isolation diffusion regions bound the lateral transistors.

It is known that lateral p-n-p transistors have a small power amplification which can be improved by providing a buried layer below the emitter and the collector so as to reduce the injection efficiency at the area where the emitter current cannot be collected.

The principal drawback of such a structure is that the base-collector breakdown voltage is reduced.

For that purpose, in a variation of the method according to the invention the substrate is given p conductivity type, deposits of arsenic as an impurity which causes the first conductivity type in the semiconductor and deposits of boron as an impurity which causes the second conductivity type in the semiconductor are provided on the substrate, after which the regions are subjected to a thermal treatment between the deposition of the epitaxial layers of the n-conductivity type, an arsenic diffusion region being formed in the first layer with a depth which is substantially equal to the thickness of the first layer, an emitter is formed in the second epitaxial layer, which layer reaches up to the arsenic diffusion region, simultaneously with the formation of the isolation diffusion region, and a collector is formed in the second epitaxial layer.

In depositing semiconductor material in two layers, the impurity of the first conductivity type may be allowed to diffuse throughout the thickness of the first epitaxial layer and the second layer may be kept free from the said impurity as a result of the cleaning of the apparatus between the deposition of the two layers. As a result of this, on the one hand, the concentration of the arsenic at the surface of the first layer can be controlled and, on the other hand, the resistance of the second layer can be controlled and it can be determined how deep the boron has to be diffused to obtain the collector.

As a result of this the depth of the emitter and the collector and the base-collector breakdown voltage are readily determined.

The invention furthermore relates to a semiconductor device manufactured by means of the method according to the invention.

In order that the inventon may be readily carried into effect, one embodiment thereof will now be described in greater detail, by way of example, with reference to the accompanying drawings, in which FIGS. 1 to 4 diagrammatically show a part of a semiconductor device according to the invention in successive stages of manufacture.

In the following example the manufacture of a p-n-p transistor will be described. The substrate is of the p-type and the epitaxial layer is of the n-type but it is obvious that an n-p-n transistor could be manufactured by means of the same method in the case in which the substrate is of the n-type and the epitaxial layer is of the p-type.

It is to be noted that the dimensions in the figure are not drawn to scale, in particular in the direction of the thickness.

Surface layers of oxide as a result of the various thermal treatments are not shown. In the description of the figures the formation of the said protective layers is not shown since the formation of such layers and of windows therein at desirable places are conventional treatments which precede the diffusion. Deposition or prediffusion of the impurity which is desirable to be diffused is not always stated either; the diffusion treatments are preceded by a deposit of an impurity.

In the figures, corresponding elements are referred to by the same reference numerals.

For manufacturing, in accordance with the invention, an integrated circuit having a lateral transistor the starting material is a silicon substate 1 of the p-type on a surface 2 of which substrate, which is suitably pretreated, local regions 3*a* are formed with impurities of the same type as the substrate, for example, boron, but with a much higher concentration, and regions 4*a* of a low resistance and with a conductivity type opposite to that of the substrate 1, for example, by means of arsenic. The regions 3*a* of the $p^+$ type which are to form the isolation diffusion region 3 and the regions 4*a* of the $n^+$ type which are to form the buried layer 4 are given the desirable shape by means of conventional masking methods (see FIG. 1).

Figure 2:
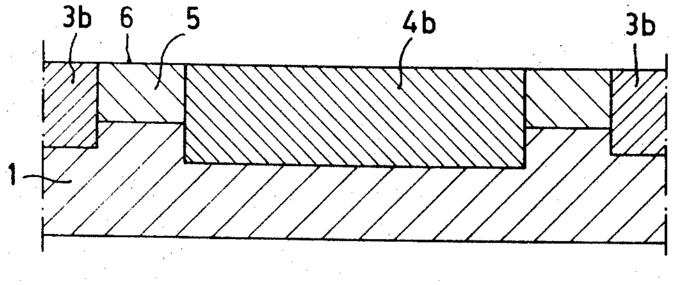
Figure 3:
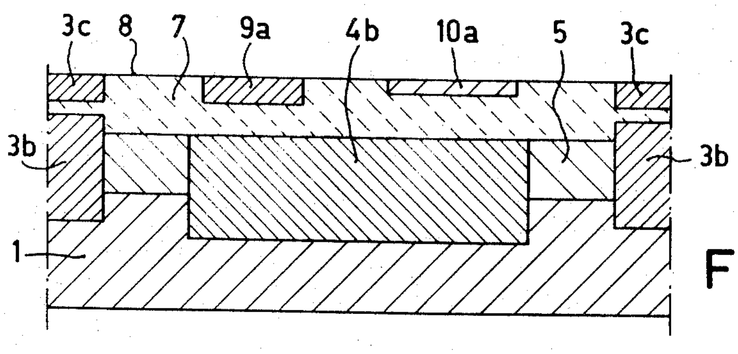

A first epitaxial layer 5 of a conductivity type opposite to that of the substrate is deposited on the surface 2 of the substrate 1, including the regions 3*a* and 4*a*, so a layer of the n-type with a large resistance. By suitable thermal treatments the impurities are allowed to diffuse from the regions 3*a* and 4*a* until they reach the surface 6 of the first epitaxial layer 5. The resulting structure is shown in FIG. 2, in which the regions 3*a* and 4*a* are developed transversely to the forms 3*b* and 4*b*. At this instant the apparatus is cleaned so as to remove the arsenic which may be enclosed.

After the cleaning, a second epitaxial layer 7 of the same conductivity type as the preceeding layer 5, some of the n-type (FIG. 3) is deposited on the surface 6 of the epitaxial layer 5 including the regions 3*b* and 4*b*.

The regions of the $p^+$ type are formed via the surface 8 of the layer 7, namely 3*c* to form the isolation diffusion regions and 9*a* to form the emitter, and a deposit 10*a* of the p-type to form the collector. The regions 3*c* and 9*a* can be formed simultaneously and the region 10*a* can be provided simultaneously with, for example, the base of an n-p-n transistor or with a resistor which forms part of the same integrated circuit.

Figure 4:
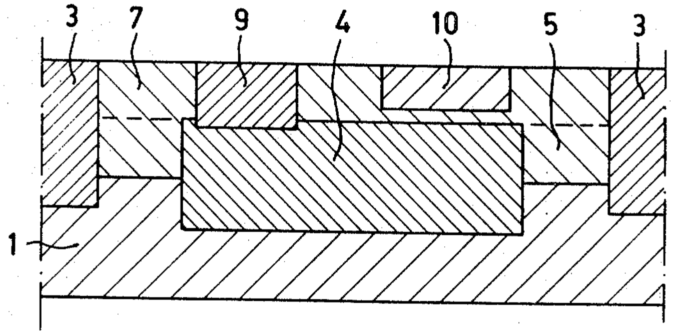

By means of a suitable thermal treatment the various deposits are diffused so as to obtain the ultimate structure shown in FIG. 4. The deposits 3*c* have united with the deposits 3*b* so as to form the isolation region 3, while the deposit 9*a* slowly penetrates into the buried layer 4 and forms the emitter 9. It is to be noted that during the thermal treatments which are necessary for realizing the second epitaxial layer 7 and the regions 3*c*, 9*a* and 10*a*, the thickness of the region 4*b* varies little as a result of the high resistance which is given to the layer 7 by etching the surface 6 of the layer 5 and cleaning the apparatus.

The diffusion depth of the region 10*a* which forms the collector is calculated as a function of the concentration at the surface of the buried layer 4 and of the resistance of the second epitaxial layer 7, so that the distance between the collector 10 and the buried layer 4 is 3 to 4 $\mu$m. The base of the resulting p-n-p transistor is formed by the part of the layer 7 which is situated between the emitter 9 and the collector 10.

What is claimed is:

1. A method of making a semiconductor device, comprising the steps of forming in a semiconductor substrate adjacent a surface thereof a first buried region having a high concentration of impurities producing a first type of conductivity, said substrate being of a second type of conductivity epitaxially depositing on said surface a first epitaxial layer of the first type of conductivity, heating the substrate and first epitaxial layer until first type impurities in the said substrate buried region out-diffuse through the first epitaxial layer to its surface, thereafter cleaning the said surface of the first epitaxial layer, thereafter epitaxially depositing a second epitaxial layer of the first type of conductivity on the cleaned surface of the first epitaxial layer in an apparatus which is substantially free from the said impurities, and thereafter building a semiconductor device into the second epitaxial layer and over the buried region.

2. A method as set forth in claim 1 wherein the cleaning step comprises etching of the said surface.

3. A method as set forth in claim 2 wherein a second buried region of the second type of conductivity is provided in the substrate so as to surround the first buried region, a region of the second type of conductivity is formed in the second epitaxial layer over the second buried region, and the last-named region and the second buried region are extended until they meet to form an annular isolation region.

4. A method as set forth in claim 3 wherein a lateral transistor is formed over the first buried region by forming in the second epitaxial layer a surface emitter region of the second type which extends down into the out-diffused region of the first type in the first epitaxial layer and adjacent to but spaced from the emitter a surface collector region of the second type which remains spaced from the out-diffused region.

5. A method as set forth in claim 4 wherein the impurities used for the first buried region are arsenic, and the impurities used for the second buried region are boron.

6. A method as set forth in claim 5 wherein the first epitaxial layer has a thickness at least equal to one micromoter, and the second epitaxial layer has a thickness substantially the same as that of the first layer.

References Cited

UNITED STATES PATENTS

| | | | |
|---|---|---|---|
| 3,208,888 | 9/1965 | Ziegler et al. | 148—175 |
| 3,260,902 | 7/1966 | Porter | 317—235 |
| 3,299,329 | 1/1967 | Pollock | 317—235 |
| 3,327,182 | 6/1967 | Kisinko | 317—235 |
| 3,404,450 | 10/1968 | Karcher | 29—577 |
| 3,506,891 | 4/1970 | Luce | 148—175 X |
| 3,506,893 | 4/1970 | Dhaka | 148—191 X |
| 3,522,164 | 7/1970 | Sumner | 148—175 X |
| 3,523,046 | 8/1970 | Grochowski et al. | 148—175 |
| 3,524,113 | 8/1970 | Agusta et al. | 317—235 |
| 3,660,180 | 5/1972 | Wajda | 148—175 |

FOREIGN PATENTS

| | | | |
|---|---|---|---|
| 986,403 | 3/1965 | Great Britain | 148—175 |
| 1,422,157 | 11/1965 | France | 148—175 |

OTHER REFERENCES

Doo et al.: "Growing High Resistivity Epitaxial Films on Low Resistivity Silicon Substrates," IBM Tech. Discl. Bull., Vol. 5, No. 2, 1962, pp.50, 51.

L. DEWAYNE RUTLEDGE, Primary Examiner

W. G. SABA, Assistant Examiner

U.S. Cl. X.R.

29—576, 577; 117—201, 212; 148—187, 191; 317—235 R